(12) United States Patent
Mercurio et al.

(10) Patent No.: US 12,522,154 B2
(45) Date of Patent: Jan. 13, 2026

(54) ELECTRIC CONTROL UNIT (ECU) FOR A VEHICLE

(71) Applicant: FCA US LLC, Auburn Hills, MI (US)

(72) Inventors: Carlo V Mercurio, Clinton Township, MI (US); Kelly A Chianetta, Shelby Township, MI (US); Jonathan D Meeuwsen, Oxford, MI (US)

(73) Assignee: FCA US LLC, Auburn Hills, MI (US)

( * ) Notice: Subject to any disclaimer, the term of this patent is extended or adjusted under 35 U.S.C. 154(b) by 274 days.

(21) Appl. No.: 18/496,979

(22) Filed: Oct. 30, 2023

(65) Prior Publication Data

US 2025/0136020 A1 May 1, 2025

(51) Int. Cl.
*H05K 7/20* (2006.01)
*B60R 11/02* (2006.01)
*B60R 16/023* (2006.01)

(52) U.S. Cl.
CPC ...... *B60R 11/0264* (2013.01); *B60R 16/0231* (2013.01)

(58) Field of Classification Search
CPC .. H05K 5/0026; H05K 5/0039; H05K 5/0047; H05K 5/0052; H05K 5/0065; B60R 16/005; B60R 16/02; B60R 16/0231; B60R 16/0234; B60R 16/0239; B60R 16/03; H02G 3/081
See application file for complete search history.

(56) References Cited

U.S. PATENT DOCUMENTS

| | | | | |
|---|---|---|---|---|
| 6,052,283 | A * | 4/2000 | Kawakita | H02B 1/56 361/695 |
| 2013/0248243 | A1* | 9/2013 | Dinh | H02G 3/081 174/535 |
| 2014/0131536 | A1* | 5/2014 | Riedel | B60R 16/0239 248/231.9 |
| 2018/0206348 | A1* | 7/2018 | Funahashi | H05K 5/0047 |
| 2020/0068732 | A1* | 2/2020 | Tashiro | H02G 3/14 |
| 2020/0169067 | A1* | 5/2020 | Takahashi | H05K 5/0247 |
| 2020/0406841 | A1* | 12/2020 | Carnick | B60R 16/0238 |
| 2021/0175697 | A1* | 6/2021 | Tashiro | B60R 16/0239 |
| 2021/0273433 | A1* | 9/2021 | Aimu | B60R 16/0215 |
| 2022/0394863 | A1* | 12/2022 | Pierik | H05K 5/0052 |
| 2023/0024613 | A1* | 1/2023 | Arai | E02F 9/0883 |
| 2024/0294127 | A1* | 9/2024 | Fujiura | G06F 8/65 |

(Continued)

*Primary Examiner* — Anthony Q Edwards
(74) *Attorney, Agent, or Firm* — Jeremy J. Klobucar

(57) ABSTRACT

An electronic control unit (ECU) for a vehicle, such as an engine control module (ECM), with a hinged design that can be conveniently mounted in an engine compartment where space is limited. The ECU generally includes a lower bracket with mounting and hinging features, an upper bracket with attachment and hinging features, and an electronic module with attachment features. The mounting features of the lower bracket enable the lower bracket to be stationarily mounted or attached within the engine compartment. The hinging features of the lower and upper brackets engage one another so that the upper bracket can hinge, with respect to the lower bracket, thereby pivoting the ECU between closed and opened positions. The attachment features of the upper bracket and electronic module engage one another so that the electronic module is attached to the upper bracket. A method of using the ECU is also disclosed.

20 Claims, 4 Drawing Sheets

(56) References Cited

U.S. PATENT DOCUMENTS

| | | | |
|---|---|---|---|
| 2024/0322537 A1* | 9/2024 | Ejima | H05K 7/06 |
| 2024/0409046 A1* | 12/2024 | Ukai | B60R 16/0231 |
| 2025/0130079 A1* | 4/2025 | Robertson, Jr. | G01D 11/30 |
| 2025/0263032 A1* | 8/2025 | Hepp | B60R 16/0239 |

* cited by examiner

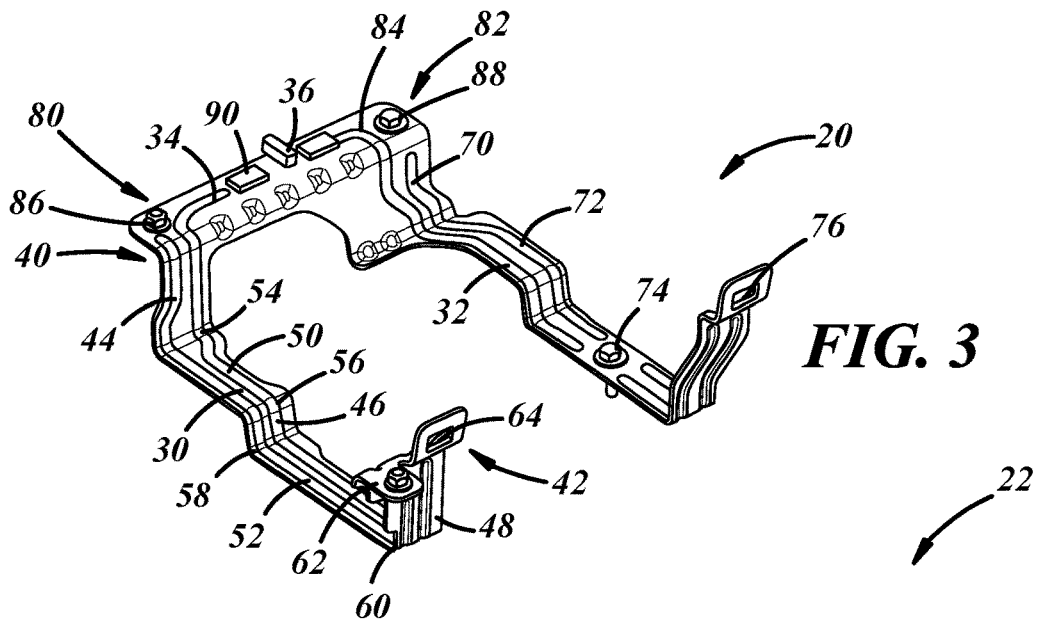
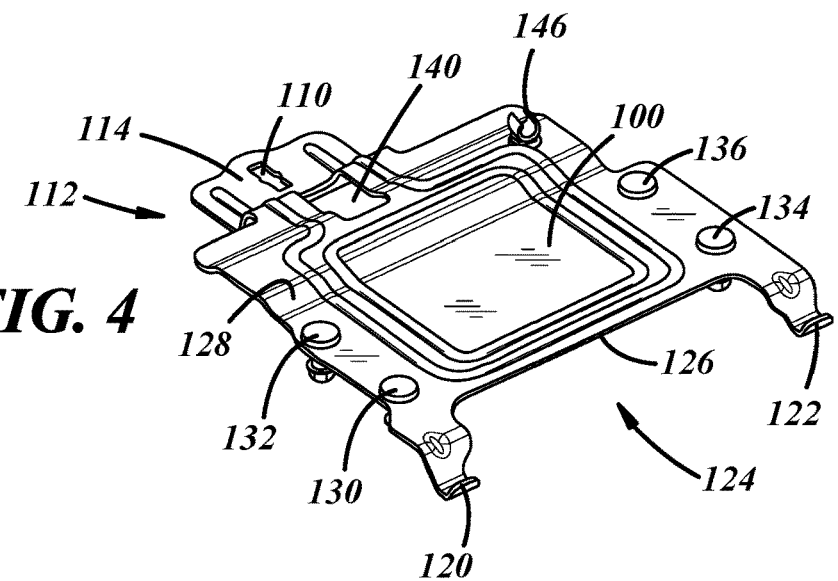
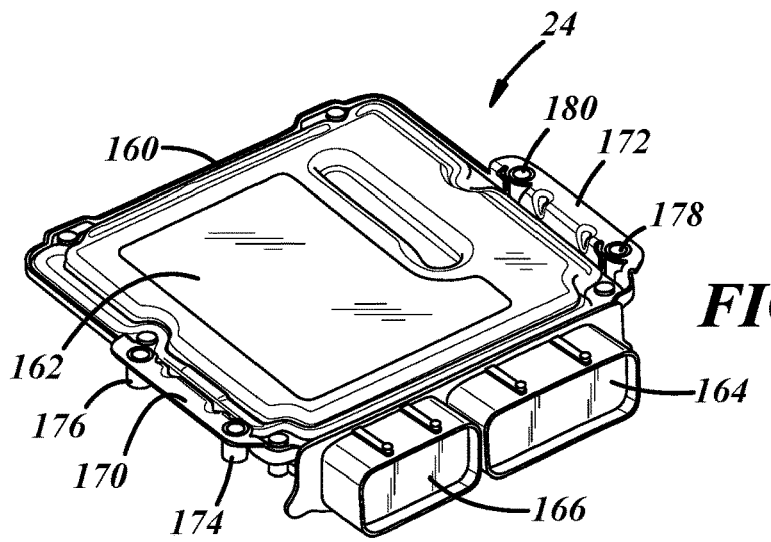

ELECTRIC CONTROL UNIT (ECU) FOR A VEHICLE

FIELD

The present disclosure relates to an electronic control unit (ECU) for a vehicle and, more particularly, to an ECU that is mounted in an engine compartment with hinging features so that it can be pivoted between opened and closed positions.

BACKGROUND

An electronic control unit (ECU), also known as an electronic control module (ECM), is an electronic device that is mounted in a vehicle and is designed to control one or more vehicle systems and/or functions. Common examples of vehicle ECUs include: engine control modules, powertrain control modules, transmission control modules, brake control modules, body control modules, suspension control modules, and general electronic modules, to name but a few.

It is generally desirable to mount an ECU at a vehicle location that is not directly exposed to the elements, has adequate airflow so that the ECU avoids overheating, is reasonably accessible so that the ECU can be conveniently serviced, and is somewhat protected in the event of a crash. In terms of engine control modules, one location that meets all the preceding requirements is the engine compartment. However, space within engine compartments, particularly those found on hybrid electric vehicles (HEVs), is becoming more and more scarce as such vehicles include an ever growing list of components that need to be mounted in the engine compartment.

It is, therefore, an object of the present application to provide an electronic control unit (ECU), such as an engine control module, that sufficiently addresses one or more of the preceding objectives.

SUMMARY

In at least some implementations, there is provided an electronic control unit (ECU) for a vehicle, comprising: a lower bracket including at least one mounting feature and at least one hinging feature, the mounting feature of the lower bracket is configured to mount the lower bracket within an engine compartment of the vehicle; an upper bracket including at least one attachment feature and at least one hinging feature, the hinging feature of the upper bracket engages the hinging feature of the lower bracket so that the upper bracket hinges with respect to the lower bracket; and an electronic module including at least one attachment feature, the attachment feature of the electronic module engages the attachment feature of the upper bracket so that the electronic module is attached to the upper bracket, wherein the hinging features of the lower and upper brackets enable the ECU to pivot between closed and opened positions.

In at least some implementations, there is also provided a method of using an electronic control unit (ECU) for a vehicle, the ECU comprises a lower bracket mounted within an engine compartment of the vehicle, an upper bracket pivotally connected to the lower bracket, and an electronic module attached to the upper bracket, and the method comprises the steps of: unlocking a latching feature so that the latching feature is in an unlocked position; rotating the upper bracket and the electronic module, with respect to the lower bracket, so that the ECU is pivoted from a closed position to an opened position; gaining access to the electronic module for servicing or replacement or to an engine compartment component located beneath the ECU; rotating the upper bracket and the electronic module, with respect to the lower bracket, so that the ECU is pivoted from an opened position to a closed position; and locking the latching feature so that the latching feature is in a locked position.

Further areas of applicability of the present disclosure will become apparent from the detailed description, claims and drawings provided hereinafter. It should be understood that the summary and detailed description, including the disclosed embodiments and drawings, are merely exemplary in nature intended for purposes of illustration only and are not intended to limit the scope of the invention, its application or use. Thus, variations that do not depart from the gist of the disclosure are intended to be within the scope of the invention.

BRIEF DESCRIPTION OF THE DRAWINGS

FIG. 3 is a perspective view of a lower bracket that is part of the ECU from FIG. 2;

FIG. 4 is a perspective view of an upper bracket that is part of the ECU from FIG. 2;

FIG. 5 is a perspective view of an electronic module that is part of the ECU from FIG. 2;

DETAILED DESCRIPTION

Figure 1:
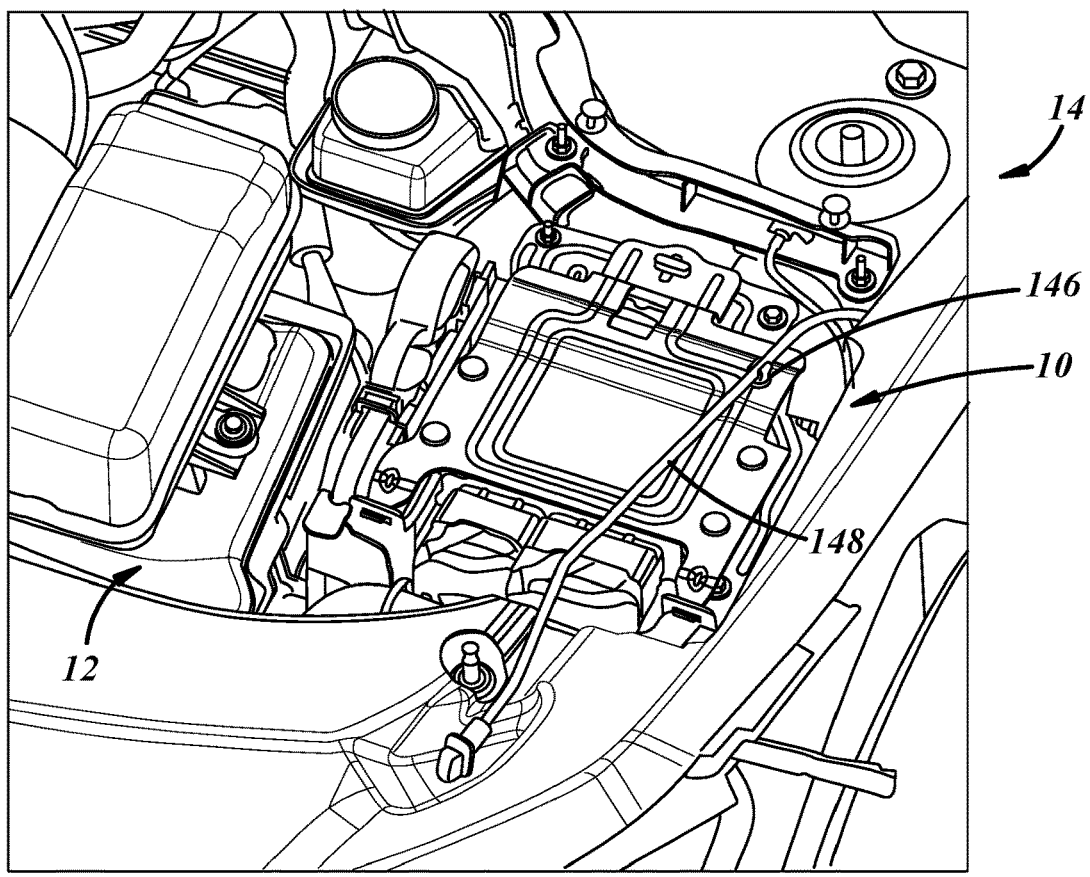
FIG. 1 is a perspective view of an engine compartment of a vehicle that includes an electronic control unit (ECU) with hinging features.

Referring in more detail to the drawings, there is shown an example of an electronic control unit (ECU) with a hinged design that can be conveniently mounted in an engine compartment of a vehicle where space is limited (e.g., over top of a power distribution center (PDC) of a hybrid electric vehicle (HEV)). It is preferable that the ECU be mounted in such a way that it is not directly exposed to the elements, has adequate airflow to avoid overheating, is reasonably accessible for easy servicing, and is somewhat protected in the event of a crash. The arrangement shown in FIG. 1, where an ECU 10 is mounted in a hinged fashion towards the front of an engine compartment 12 in a vehicle 14, accomplishes these objectives and generally includes a lower bracket 20, an upper bracket 22, and an electronic module 24.

Figure 2:
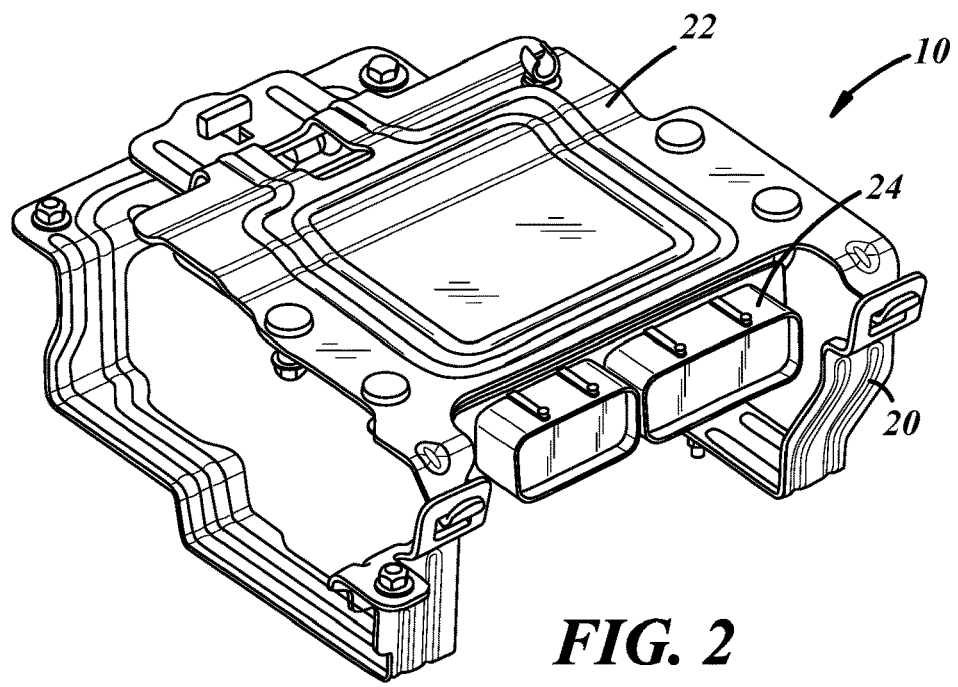
FIG. 2 is a perspective view of the ECU from FIG. 1.

With reference to FIGS. 2 and 3, lower bracket 20 is a rigid mounting bracket that is designed to attach to the vehicle 14 and to hingedly or pivotally receive the upper bracket 22. According to one example, lower bracket 20 is made from stamped metal and has a U-shape configuration with a first connection member 30, a second connection member 32, a cross member 34, and a latching feature 36. The first connection member 30 is an elongated member or piece that extends from an inner end 40, where it is integrally connected to the cross member 34, to an outer end 42 and includes one or more upright sections 44-48, one or more flat sections 50-52, one or more bends 54-60, one or more mounting features 62, and a hinging feature 64. The first connection member 32 may have any number of ribs or other strengthening features stamped or otherwise built into the member in order to provide the bracket with increased strength and/or rigidity. Other features are certainly possible as well.

Starting from the inner end 40, the first connection member 30 includes an upright section 44 that extends downwardly towards bend 54, at which point the member turns approximately 90° and extends into the flat section 50 before ending at bend 56. At bend 56, the first connection member 30 again turns approximately 90° and extends downwardly for a short distance along upright section 46 before ending at bend 58, which is also about 90°. Flat section 52 may be one of the longer sections of first connection member 30 and continues towards bend 60, at which point the member turns approximately 90° in the upwards direction. The most outbound or distal section of the first connection member 30 is upright section 48, which extends from bend 60 to the outer end 42 and may be designed to accommodate a mounting feature 62 and/or hinging feature 64.

Mounting feature 62 branches off of the upright section 48 and is designed to receive or otherwise accommodate a bolt or other fastening device so that the lower bracket 20 and, hence, the ECU 10, can be securely mounted to the vehicle 14. In one example, the mounting feature 62 includes a small flange with a bolt hole that is arranged to line up with a corresponding bolt hole in engine compartment 12 so that a bolt or the like can be inserted therethrough and can secure the ECU 10 to a suitable engine compartment component, like an engine bracket, an alternator, a sidewall of the engine compartment, etc. Mounting features other than bolts and nuts could also be used, such as mechanical fasteners, welds, adhesives, etc.

Hinging feature 64 engages a corresponding hinging feature of the upper bracket 22 so that the upper bracket can hinge or pivot with respect to the lower bracket. In FIG. 3, the hinging feature 64 is shown as a simple cutout or opening formed in a flange at the end of upright member 48 and is shaped and sized to receive a corresponding tab or ear of the upper bracket 22, as will be discussed. Because of their design, the hinging features of the lower and upper brackets not only allow the upper bracket 22 to hinge, with respect to the lower bracket 20, they also allow the upper bracket to be completely removed from the lower bracket; this can be useful when, for example, the electronic module 24 needs to be serviced and/or replaced. Other hinging or pivoting features may be used instead, such as various types of: hinges; pivots; pivot hinges; pivot sets; joints; pivoting joints; latching joints; as well as the hinging feature shown in the drawings, except where the cutouts and tabs are reversed on the upper and lower brackets.

The first connection member 30 is shown with three upright sections 44-48, two flat sections 50-52, four bends 54-60, and mounting and hinging features 62-64 located towards a distal end of the outermost upright section 48, but this is not necessary. It should be appreciated that first connection member 30 may include any number of upright sections, flat section, bends and/or other features and is not limited to the embodiment shown in the drawings. Furthermore, the size and/or shape of these sections may differ, as can the bend angles involved.

Second connection member 32 is similar to the first connection member 30, with some differences being possible. A duplicate description of the connection member has been omitted, as the preceding discussion of member 30 applies to member 32 as well. One possible difference between the first and second connection members pertains to the number and/or configuration of the different upright sections, flat sections and/or bends. For instance, second connection member 32 may include an upright section 70 and/or a flat section 72 that differs in size and/or configuration from its first connection member counterpart. Such differences may be needed to spatially accommodate nearby components or devices in the engine compartment (e.g., the first connection member 30 may be configured to fit over top of a certain hose or belt, whereas the second connection member 32 may be configured to fit over top of an air filter or the like). Another potential difference relates to the location of mounting feature 74 which, instead of being located at the distal end of the outermost upright section, like mounting feature 62, mounting feature 74 is formed in a flat section located between inner and outer ends of the second connection member 32. Mounting feature 74 may include a bolt hole that lines up with a corresponding bolt hole in engine compartment 12 so that a bolt or the like can be inserted therethrough and can help secure the ECU 10 in place. Skilled artisans will appreciate that the type and/or location of the mounting features will largely be dictated by the engine compartment components to which the lower bracket is being attached. Hinged feature 76 may be similar to hinged feature 64, but alternative arrangements could be used instead.

Cross member 34 spans between and is integrally connected to the first and second connection members 30, 32. According to the illustrated example, cross member 34 includes a first end 80 connected to the inner end of the first connection member 30, a second end 82 connected to the inner end of the second connection member 32, and a flat section 84. The flat section 84 may accommodate the latching feature 36, one or more mounting features 86, 88, as well as one or more optional pads or cushions 90.

Latching feature 36 is designed to conveniently latch or secure the upper bracket 22 to the lower bracket 20 when the ECU 10 is in a closed position, as shown in FIGS. 1 and 2, and may include one of any number of different types of latching mechanisms. In one example, the latching feature 36 is a simple, quarter-turn winged lever nut that is sized and shaped to extend through a corresponding slot in the upper bracket 22. When the winged lever nut is parallel to the corresponding slot, it can extend therethrough in an unlocked position; when the winged lever nut is extended through and is turned perpendicular to the corresponding slot, it cannot be backed out and is in a locked position.

Mounting features 86, 88 are located at the first and second ends 80, 82 of cross member 34, respectively, and may include bolt holes for securing the lower bracket 20 to the vehicle, like the other mounting features already described. In the current example, a total of four mounting features 62, 74, 86 and 88 are used to fasten down the lower bracket 20 near its four corners, but other numbers, arrangements and/or types of fasteners may be used instead. It is possible, for example, for either the lower bracket 20 or an underlying engine compartment component to have one or more threaded studs that protrude through corresponding openings in the other of the lower bracket or underlying engine compartment, such that nuts can be threaded onto the studs to hold the components in place.

Pads or cushions 90 may be positioned on flat section 84 such that they flank the latching feature 36 on both sides and face upwardly towards an underside of the upper bracket 22. This way, when the upper bracket 22 is latched to the lower bracket 20 in a closed position, the pads 90 will take up any tolerances and create a secured tension between the brackets so that they do not rattle or vibrate against each other. In one example, pads 90 are thick foam pads with adhesive on an underside for sticking to the cross member 34. Other sound and/or vibration damping features may be used in addition to or in lieu of pads or cushions.

Turning now to FIGS. 2 and 4, there is shown an example of the upper bracket 22, which is designed to carry the electronic module 24 and to hingedly or pivotally connect to the lower bracket 20. The upper bracket 22 acts as a pivotable and/or removable cover for the ECU 10 and may be made from stamped metal or rigid plastic in order to protect the electronic module 24, which is fastened to its underside. According to one example, the upper bracket 22 includes a plate member 100, a latching feature 110 located at a free end 112 of the upper bracket, one or more hinging features 120, 122 located at a pivoting end 124 of the upper bracket, one or more attachment features 130-136 for securely mounting the electronic module 24 to an underside 126 of the upper bracket, and a topside 128 of the upper bracket.

Plate member 100 forms much of the upper bracket 22 and can be rectangular in shape with the free end 112 located on one side and the pivoting end 124 located on another, opposite side. The free end 112 is the end or side of the upper bracket 22 that can pivot towards and away from the lower bracket 20, whereas the pivoting end 124 is the end or side of the upper bracket that pivots or rotates about an axis. The plate member 100 may be planar or nearly planar, or it can have a series of contours that are designed to follow corresponding contours of the electronic module 24, the underside of the vehicle hood and/or some other engine compartment component, to cite a few possibilities. Plate member 100 may include any number of ribs or other strengthening features that are stamped or otherwise built into the member, including multiple ribs that are generally concentric with one another, as shown. Plate member 100 may also include a cutout or opening 140 that is located towards the free end 112 and provides a user with a handle so they can pull the upper bracket 22 open when in the unlocked position. Of course, a traditional handle or the like could be used instead. Depending on the intended location of the ECU 10 within the engine compartment 12, a hood prop rod clip 146 may be provided on the topside 128 to receive a hood prop rod 148, when it is not in use (see FIG. 1). In addition to simply securing the hood prop rod 148 in place, the hood prop rod clip 146 may also act as a locating or redundancy feature of sorts, since the clip 146 will only line up and receive the rod 148 when the upper bracket 22 is in the closed and locked positions; thus, helping to ensure that the hood is not closed while the upper bracket is in the opened and/or unlocked positions.

Latching feature 110 is designed to interact with the corresponding latching feature 36 of the lower bracket 20 and may be provided according to any number of different embodiments. According to the illustrated embodiment, the latching feature 110 is formed in a flat section or flange 114 that extends from the free end 112 of the upper bracket and includes a slot or opening that is sized and shaped to receive the quarter-turn winged lever nut 36. The slot should be large enough to allow the lever nut to pass through it when they are parallel to one another, and small enough to trap the lever nut and prevent it from backing out when they are perpendicular to one another. It should be noted that other latching features, such as other mechanical latching mechanisms and/or magnetic latching mechanisms, may be used instead, and that the different components of such latching mechanisms may be located on the lower bracket and/or upper bracket, as they are not specifically limited to the latching feature shown in the drawings.

Hinging features 120, 122 are configured to interact with the hinging features 64, 76 of the lower bracket 20 and, like the latching features, may be provided according to any number of different embodiments. Hinging features 120, 122 may include simple curved or upturned tabs or ears that are sized and shaped to extend through and engage with hinging features 64, 76, respectively, such that the entire upper bracket 22 may hinge or pivot with respect to the lower bracket 20, which is stationary. Other hinging mechanisms may be used instead.

Attachment features 130-136 are used to securely fasten or mount the electronic module 24 to the underside 126 of the upper bracket 22. In one example, the attachment features 130-136 simply include bolt holes that line up with corresponding bolt holes in the electronic module 34 so that bolts and nuts can be used to threadingly secure the electronic module in place. In another example, the attachment features 130-136 include threaded studs that extend downwardly from the underside 126 of the upper bracket through either holes or bosses in the electronic module and are secured in place with nuts. In yet another example, the attachment features 130-136 include threaded studs or the like that extend upwardly from the electronic module and extend through corresponding holes in the upper bracket. It should be appreciated, however, that any suitable type of attachment feature may be used and the present application is not limited to the examples provided above.

With reference to FIGS. 2 and 5, there is shown an example of an electronic module 24 that may be used with the upper and lower brackets 20, 22. As previously explained, the electronic module 24 is mounted to the underside 126 of the upper bracket 22 so that the ECU 10 can be pivoted or rotated between closed and opened positions, which provides greater access for servicing the module. According to one example, the electronic module 24 is an engine control module (ECM) and may include any suitable collection of electronic circuitry, circuit boards, connections, etc. (not shown) that are needed for carrying out the functions of a typical ECM, as well as a lower module housing 160, an upper module housing 162, and one or more terminal connections 164, 166.

Lower and upper module housings 160, 162 enclose and protect the electronic circuitry and/or other components of the electronic module 24 and may be made from stamped metal or rigid plastic. In one example, the lower module housing 160 is shaped as a shallow pan or dish and supports and protects the electronic circuitry, whereas the upper module housing 162 is shaped as a flat lid or cover and is secured onto the lower module housing with one or more bolts or other attachment features, possibly with a rubber gasket being located therebetween so that the enclosure is sealed against the elements. The lower and/or upper module housings 160, 162 may have any number of ribs or other strengthening features, as well as recesses, pockets, projections, etc. stamped or otherwise built into the housing pieces. Lower module housing 160 may include a pair of thin mounting flanges 170, 172 that are located on opposite sides of the housing and extend outwardly away from the housing in order to accommodate one or more attachment features 174-180 that help secure the electronic module 24 to the upper bracket 22. In the illustrated example, the attachment features 174-180 are provided as small, cylindrical bosses that extend downwardly from the mounting flanges 170, 172 so that they can receive a bolt or other fastener from the upper bracket 22 and a nut for retaining the bolt in place.

Figure 7:
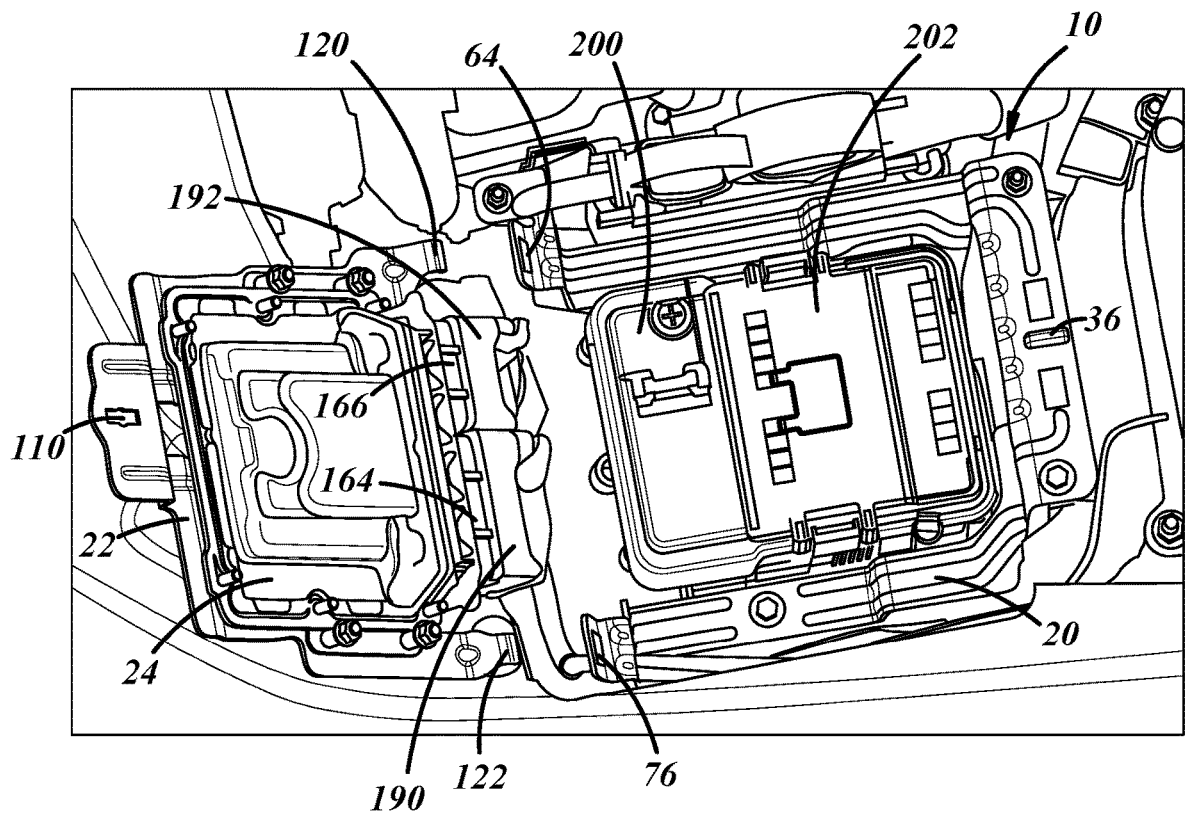
FIG. 7 is a perspective view of the engine compartment from FIG. 1, where the ECU has been pivoted to an opened position.

Terminal connections 164, 166, also known as terminal blocks, are electrical connections that are designed to be both mechanically and electronically coupled to wiring harnesses 190, 192, respectively (see FIG. 7). Those skilled in the art will appreciate that any number of different terminal connection types and configurations may be used, depending on the particular needs of the electronic module 24.

As previously mentioned, the design and configuration of the electronic control unit (ECU) 10 advantageously allows it to be directly mounted over top of at least a portion of a power distribution center (PDC) 16 of a hybrid electric vehicle (HEV) 14. This mounting location, which is just beneath the underside of the hood in one of the highest available planes within the engine compartment 12, provides the ECU with a number of potential advantages.

For instance, the high mounting location within the engine compartment 12 (e.g., one that is above a water fording line) isolates the ECU 10 from much of the water, dirt, salt, debris and/or other elements that are present under the vehicle and negatively impact ECUs installed at lower mounting locations. Another potential advantage of the high mounting location involves airflow, as ECUs can generate a substantial amount of heat. In order to prevent the ECU 10 from overheating, it should be exposed to an adequate amount of airflow, which is typically available at high mounting locations where fewer engine compartment components obstruct the flow of air. Furthermore, it is desirable for the ECU 10 to be mounted at a location that is easily accessible for purposes of servicing the unit. The high mounting location causes the ECU 10 to be in plain sight and directly accessible to an operator when the hood is open and the hood prop rod 148 is moved out of the way. If access is needed to any of the PDC components located beneath the ECU 10 (e.g., terminals of a vehicle battery 200 and/or a fuse box 202), then the ECU can simply be pivoted or rotated out of the way, while still staying connected to the vehicle electrical system via wiring harnesses 190, 192 (see FIG. 7). One more potential advantage of the mounting location is that it somewhat protects the ECU 10 in the event of a crash. ECUs typically need to be functional for a certain amount of time immediately following a crash or impact (e.g., about 300 msec) so that the ECU 10 can perform any necessary functions before shutting down. Some locations, such as within a front fender, may not provide such protection. The high mounting location of the ECU 10, on the other hand, helps elevate it overtop of other components so that it can be somewhat more centrally located within the engine compartment 12, thereby providing it with additional crash protection.

According to one embodiment, the aforementioned advantages are achieved when the ECU 10 is installed in a high mounting location within an engine compartment 12 such that the ECU is located: just beneath the underside of the hood (in an elevation direction), inboard of a fender structure and/or an engine compartment upper rail (in a lateral or side-to-side direction), and towards the middle of the engine compartment in front of a shock tower (in a longitudinal or front-to-back direction).

Figure 6:
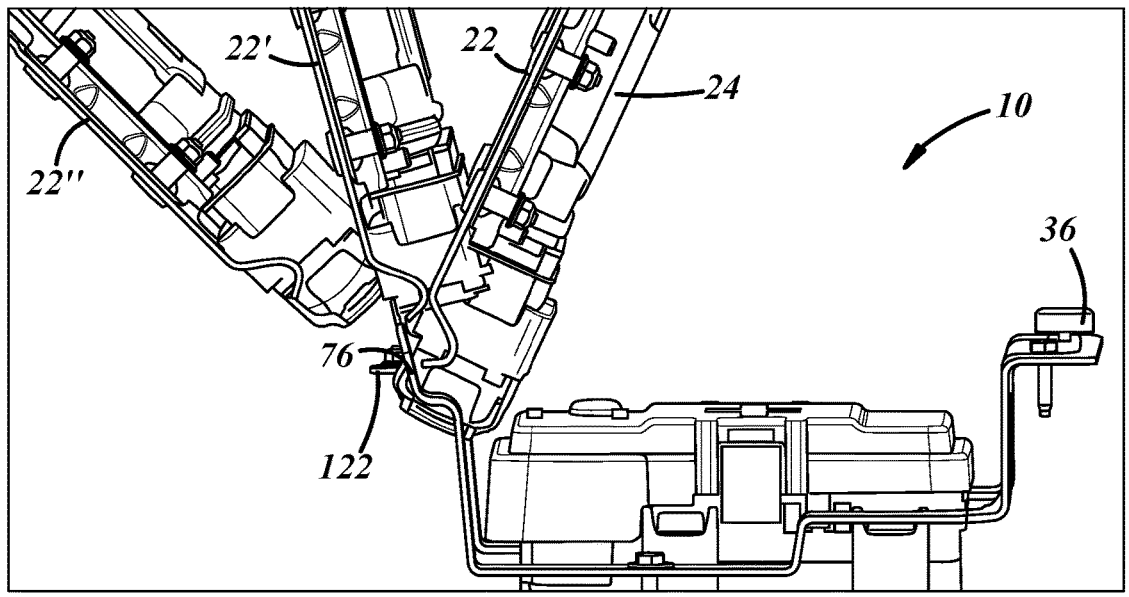
FIG. 6 is a side view of the ECU from FIG. 2, where the upper bracket and the electronic module are shown pivoting through different positions.

Turning now to FIGS. 6 and 7, there is described a potential method for gaining access to and/or servicing the ECU 10. An operator first opens the hood and disengages the hood prop rod 148 by moving it to an out-of-the-way position. Next, the operator unlocks the latching feature 36 by turning the quarter-turn winged lever nut so that it is aligned in the direction latching feature 110, which is in this example is a slot. Now that latching feature 36 is in an unlocked position, the upper bracket 22 and electronic module 24 can be rotated such that the ECU pivots from a closed position to an opened position. FIG. 6 shows several different rotational positions of upper bracket 22 being pivoted about an axis that is generally formed by hinging features 64, 76 of the lower bracket and hinging features 120, 122 of the upper bracket. Once the upper bracket 22', 22" is pivoted a certain amount, it may be completely removed or separated from the lower bracket 20. At this point, the upper bracket 22 and electronic module 24 may be flipped over so that the terminal connections 164, 166 can be disconnected from wiring harnesses 190, 192, respectively, and the electronic module can be easily worked on. It is also possible to pivot the ECU to an opened position and/or remove the upper bracket from the lower bracket while keeping the electronic module connected to wiring harnesses 190, 192. This process provides easy access to the ECU 10, as well as to components of the underlying PDC, like the vehicle battery 200 and/or fuse box 202, and other engine compartment components that may need to be serviced.

A reverse method could then be used to reconnect and install the ECU 10 within the engine compartment 12.

Figure 8:
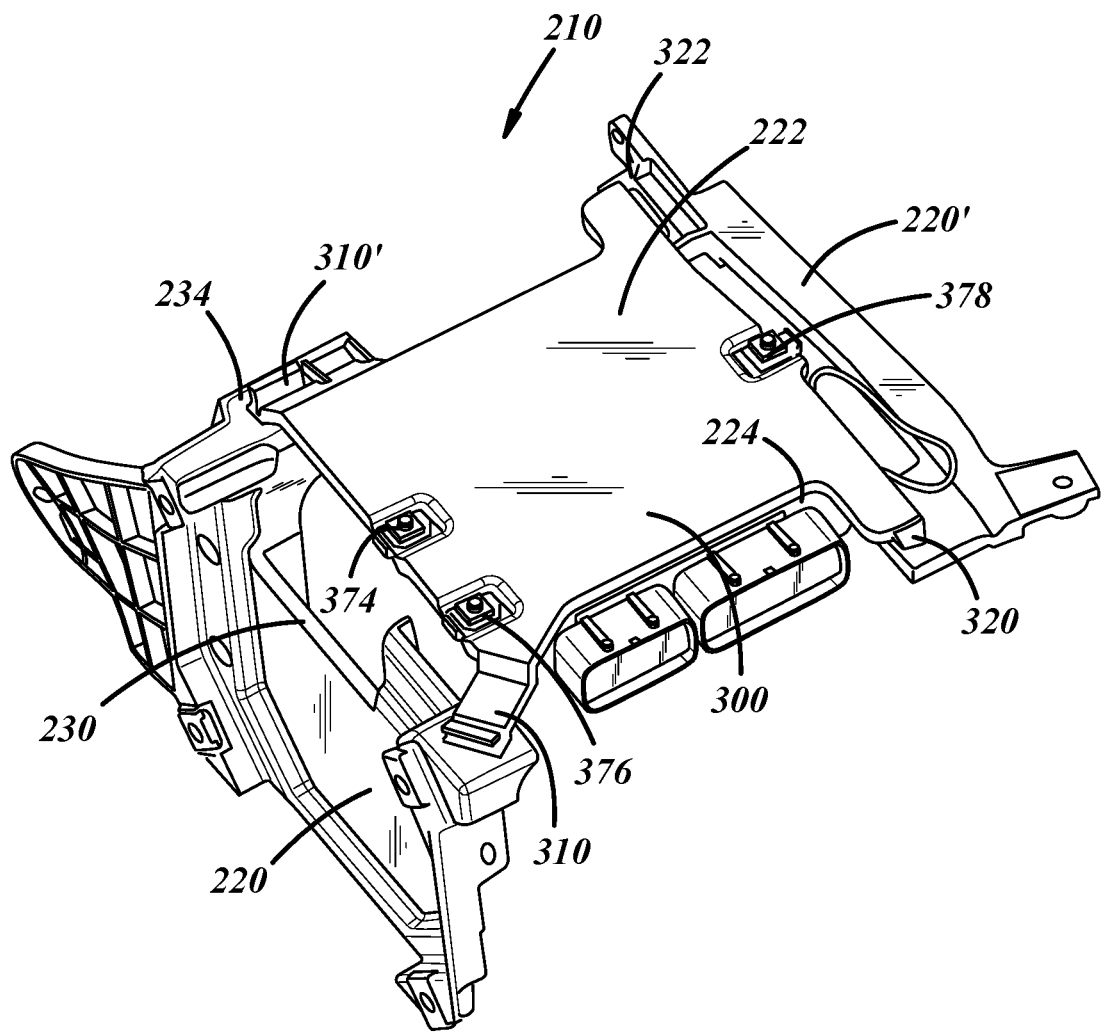
FIG. 8 is a perspective view of another embodiment of an electronic control unit (ECU) with hinging features.

With reference to FIG. 8, there is shown another example of an electronic control unit (ECU) 210 that includes lower brackets 220, 220', upper bracket 222, and an electronic module 224. Many of the features of ECU 210 are similar to ECU 10 and, thus, are not repeated here.

One potential difference pertains to lower brackets 220, 220', which are two separate bracket pieces, as opposed to being a single unitary piece like the embodiment shown in FIG. 3. Lower brackets 220, 220' may be asymmetrical such that they are unique and different from one another or they may be symmetrical, and they may be comprised of the same material (e.g., stamped metal or rigid plastic) or they may be made from different materials, to cite two possibilities. Lower bracket 220 has a connection member 230 that is mounted or attached within the engine compartment such that it helps stabilize the ECU, and it includes a partial cross member 234 that supports the upper bracket 222 but does not extend all the way across to the other lower bracket 220'. Of course, the exact configuration of lower bracket 220 can differ from that shown here. Lower bracket 220' is a separate bracket piece that is located on an opposite side of the ECU as upper bracket 220 and hingedly supports the upper bracket 222. The exact configuration of lower bracket 220' can vary depending on the particular vehicle or application in which it is used. According to one potential implementation, lower bracket 220 is securely fastened to the floor of the engine compartment or some other engine compartment component, whereas lower bracket 220' is secured fastened to a sidewall of the engine compartment.

Upper bracket 222 is similar to the previous embodiment, except that it includes a plate member 300, latching features 310, 310', and hinging features 320, 322 that are slightly different. Plate member 300 is arranged so that hinging members 320, 322 are outboard hinges located on a pivoting side of the plate member, as opposed to being on a pivoting end, like in the former embodiment. A hood prop rod clip may be omitted from the topside of the plate member 300. Two latching features 310, 310' are provided in the form of snap features and replace the single slot and winged lever nut of the previous embodiment, although either type of latching feature may be used.

Electronic module 324 is largely the same as the previous embodiment, except that attachment features 374, 376, 378 may include a suitable combination of screws and clips to securely attach the electronic module 224 to the underside of the upper bracket 222. Other changes may also be included, as the present ECU is not limited to the specific embodiments shown here.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. An electronic control unit (ECU) for a vehicle, comprising:
    a lower bracket including at least one mounting feature and at least one hinging feature, the mounting feature of the lower bracket is configured to mount the lower bracket within an engine compartment of the vehicle;
    an upper bracket including at least one attachment feature and at least one hinging feature, the hinging feature of the upper bracket engages the hinging feature of the lower bracket so that the upper bracket hinges with respect to the lower bracket; and
    an electronic module including at least one attachment feature, the attachment feature of the electronic module engages the attachment feature of the upper bracket so that the electronic module is attached to the upper bracket, wherein the hinging features of the lower and upper brackets enable the ECU to pivot between closed and opened positions.

2. The electronic control unit (ECU) of claim 1, wherein the lower bracket is a rigid mounting bracket with a U-shape configuration that includes a cross member, a first connection member integrally connected to a first end of the cross member, and a second connection member integrally connected to a second end of the cross member.

3. The electronic control unit (ECU) of claim 2, wherein at least one of the first or second connection member is an elongated member that extends from an inner end to an outer end and further includes one or more upright section(s), one or more flat section(s), and one or more bend(s), the hinging feature of the lower bracket is located towards the outer end of the connection member.

4. The electronic control unit (ECU) of claim 2, wherein the lower bracket further includes a latching feature with a winged lever nut attached to the cross member, and the upper bracket further includes a latching feature with a slot so that, when the ECU is in the closed position and the latching feature of the lower bracket is in a locked position, the winged lever nut extends through and is turned perpendicular to the slot.

5. The electronic control unit (ECU) of claim 2, wherein at least one of the lower bracket or the upper bracket further includes a foam pad adhered thereto, the foam pad is configured so that, when the ECU is in the closed position and a latching feature of the lower bracket is in a locked position, the foam pad creates a secured tension between the lower and upper brackets so that they do not rattle or vibrate against each other.

6. The electronic control unit (ECU) of claim 1, wherein the hinging feature of the lower bracket includes one of a cutout or a curved tab and the hinging feature of the upper bracket includes the other of the cutout or the curved tab, the curved tab extends through and is received by the cutout so that the upper bracket hinges with respect to the lower bracket and can be completely removed from the lower bracket.

7. The electronic control unit (ECU) of claim 1, further comprising an additional lower bracket that is a rigid mounting bracket and is a separate piece from the lower bracket, the additional lower bracket engages at least one latching feature on the upper bracket so that, when the ECU is in the closed position and the latching feature is in a locked position, the upper bracket cannot hinge with respect to the additional lower bracket, and when the latching feature is in an unlocked position, the upper bracket can hinge with respect to the additional lower bracket.

8. The electronic control unit (ECU) of claim 1, wherein the upper bracket is a protective cover for the electronic module and includes a plate member, a free end that is integrally connected to the plate member and can pivot towards and away from the lower bracket, a pivoting end that is integrally connected to the plate member and pivots about an axis, an underside that receives the electronic module, and a topside.

9. The electronic control unit (ECU) of claim 8, wherein the free end includes a latching feature that engages a latching feature of the lower bracket, and the pivoting end includes the hinging feature of the upper bracket that engages the hinging feature of the lower bracket, so that, when the ECU is in the closed position and the latching feature of the lower bracket is in a locked position, the upper bracket cannot hinge with respect to the lower bracket, and when the latching feature of the lower bracket is in an unlocked position, the upper bracket can hinge with respect to the lower bracket.

10. The electronic control unit (ECU) of claim 8, wherein the topside of the upper bracket includes a hood prop rod clip that is configured so that, only when the ECU is in the closed position and the latching feature of the lower bracket is in a locked position, does the hood prop rod clip receive a hood prop rod.

11. The electronic control unit (ECU) of claim 1, wherein the electronic module is an engine control module (ECM) and includes electronic circuitry for controlling the engine, a lower module housing that includes at least one mounting flange, an upper module housing, and at least one terminal connection.

12. The electronic control unit (ECU) of claim 11, wherein the lower module housing is a shallow pan that carries and protects the electronic circuitry of the engine control module (ECM), the mounting flange of the lower module housing accommodates the attachment feature of the electronic module, and the upper module housing is a flat lid that is secured to and sealed against the lower module housing.

13. The electronic control unit (ECU) of claim 12, wherein the attachment feature of the electronic module is a cylindrical boss that is connected to the mounting flange, and the attachment feature of the upper bracket is a bolt that extends through the cylindrical boss and attaches the electronic module to an underside of the upper bracket.

14. The electronic control unit (ECU) of claim 1, wherein the ECU is configured to be pivotally mounted at a high mounting within the engine compartment of the vehicle.

15. The electronic control unit (ECU) of claim 14, wherein the high mounting location is positioned: just beneath an underside of a hood, above a water fording line of the vehicle, inboard of at least one of a fender structure or an engine compartment upper rail, and in front of a shock tower.

16. The electronic control unit (ECU) of claim 14, wherein the high mounting location is positioned over top of at least a portion of a power distribution center (PDC).

17. A method of using an electronic control unit (ECU) for a vehicle, the ECU comprises a lower bracket mounted within an engine compartment of the vehicle, an upper bracket pivotally connected to the lower bracket, and an electronic module attached to the upper bracket, and the method comprises the steps of:
  unlocking a latching feature so that the latching feature is in an unlocked position;
  rotating the upper bracket and the electronic module, with respect to the lower bracket, so that the ECU is pivoted from a closed position to an opened position;
  gaining access to the electronic module for servicing or replacement or to an engine compartment component located beneath the ECU;
  rotating the upper bracket and the electronic module, with respect to the lower bracket, so that the ECU is pivoted from an opened position to a closed position; and
  locking the latching feature so that the latching feature is in a locked position.

18. The method of claim 17, further comprising the following step before the unlocking step:
  disengaging a hood prop rod from a hood prop rod clip located on a topside of the upper bracket, and moving the hood prop rod to an out of the way location.

19. The method of claim 17, wherein the gaining access step further comprises gaining access to the electronic module for servicing or replacement by completely removing the upper bracket and the electronic module from the lower bracket while the electronic module is still connected to a vehicle electrical system.

20. The method of claim 17, wherein the gaining access step further comprises gaining access to the electronic module for servicing or replacement by completely removing the upper bracket and the electronic module from the lower bracket after the electronic module has been disconnected from a vehicle electrical system.

* * * * *